(12) United States Patent
Wada et al.

(10) Patent No.: US 7,723,754 B2
(45) Date of Patent: May 25, 2010

(54) GE PHOTODETECTORS

(75) Inventors: Kazumi Wada, Lexington, MA (US);
Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 122 days.

(21) Appl. No.: 11/191,769

(22) Filed: Jul. 28, 2005

(65) Prior Publication Data

US 2006/0022226 A1     Feb. 2, 2006

Related U.S. Application Data

(60) Provisional application No. 60/591,769, filed on Jul. 28, 2004.

(51) Int. Cl.
    *H01L 29/737* (2006.01)
(52) U.S. Cl. .......... 257/198; 257/414
(58) Field of Classification Search .......... 257/233, 257/198, 414
    See application file for complete search history.

(56) References Cited

U.S. PATENT DOCUMENTS

| | | | | |
|---|---|---|---|---|
| 3,211,970 A | * | 10/1965 | Christian | 257/191 |
| 4,119,994 A | * | 10/1978 | Jain et al. | 257/198 |
| 4,831,428 A | | 5/1989 | Yamaka | |
| 5,245,204 A | | 9/1993 | Morishita | |
| 5,962,880 A | * | 10/1999 | Oda et al. | 257/198 |
| 6,043,517 A | | 3/2000 | Presting et al. | |

FOREIGN PATENT DOCUMENTS

| | | | |
|---|---|---|---|
| EP | 0638941 A2 | | 3/1994 |
| JP | 07147287 | * | 6/1995 |

* cited by examiner

*Primary Examiner*—Long Pham
(74) *Attorney, Agent, or Firm*—Gauthier & Connors LLP (57) ABSTRACT

A phototransistor includes an emitter and a base that comprises Ge. A collector comprises Si. The base, emitter, and collector form at least one Si/Ge heterojunction allowing the unpinning of Fermi energy level ($E_F$) of the phototransistor.

22 Claims, 10 Drawing Sheets

GE PHOTODETECTORS

PRIORITY INFORMATION

This application claims priority from provisional application Ser. No. 60/591,769 filed Jul. 28, 2005.

BACKGROUND OF THE INVENTION

The invention relates to the field of photodetectors, in particular photodetectors having higher breakdown voltages.

Photodetectors are fundamental devices that convert optical signals into electric signals. Fiber optical communication employs 1300 and 1550 nm wavelengths because of low attenuation coefficients of silica fibers. Er doped fiber amplifiers emphasize the importance of 1550 nm because of the direct amplification of optical signals without converting to electric signals. The amplification range between 1530-1560 nm is referred to as C-band, and the recently extended amplification range between 1570-1608 nm is referred to as L-band. The photodetectors for 1550 nm detection have so far been InGaAs photodetectors, since InGaAs is a direct semiconductor whose bandgap is 0.75 eV (corresponding to 1653 nm). Thus, InGaAs photodetectors can convert any optical signal in the C- and L-bands to electric signals. These optical fiber communication components are well developed.

High electric field application is generally necessary for photodetectors to achieve higher responsivity. However, breakdown voltage $V_{BR}$ is lower in narrow gap semiconductors which increases reverse leakage currents. Thus high field application is hard in photodetectors with similar bandgaps to Ge.

In general, the elements In, Ga, and As are all dopants in silicon to show donor or acceptor characteristics and could thus alter the circuit performance if diffused. Ge can be a candidate for on-chip photodetectors, since Ge is in the group IV element and produces no harmful effects if diffused. Thus, Ge provides a perfect opportunity to form highly efficient photodetectors.

SUMMARY OF THE INVENTION

According to one aspect of the invention, there is provided a photodiode. The photodiode includes a base that comprises Ge and a collector that comprises Si. The base and collector form a Si/Ge heterojunction allowing the unpinning of Fermi energy level ($E_F$) of the photodiode.

According to another aspect of the invention, there is provided a method of forming a photodiode. The method includes forming a base that comprises Ge, and forming a collector that comprises Si. The base and collector form a Si/Ge heterojunction allowing the unpinning of Fermi energy level ($E_F$) of the photodiode.

According to another aspect of the invention, there is provided a phototransistor. The phototransistor includes an emitter and a base that comprises Ge. A collector comprises Si. The base, emitter, and collector form at least one Si/Ge heterojunction allowing the unpinning of Fermi energy level ($E_F$) of the phototransistor.

According to another aspect of the invention, there is provided method of forming a phototransistor. The method includes forming an emitter and forming a base that comprises Ge. A collector is formed that comprises Si. The base, emitter, and collector form at least one Si/Ge heterojunction allowing the unpinning of Fermi energy level ($E_F$) of the phototransistor.

DETAILED DESCRIPTION OF THE INVENTION

Figure 1:
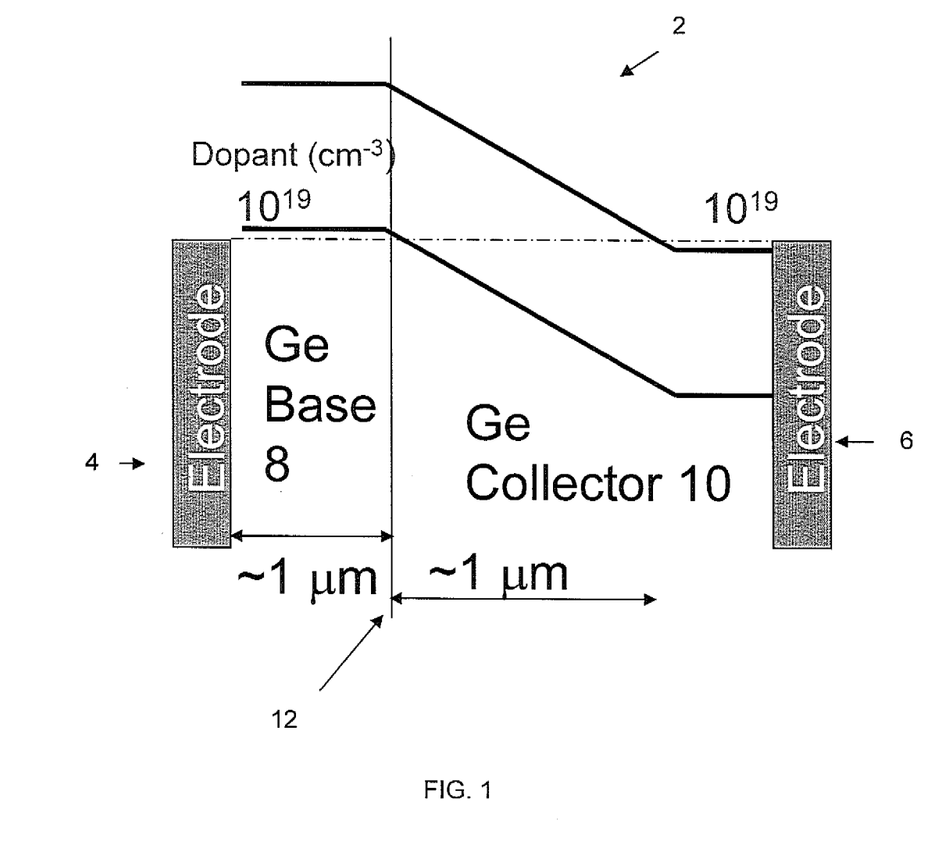
FIG. 1 is a schematic diagram that illustrates the operations of a Ge Hetero pin Photodiode.

FIG. 1 illustrates the operations of a Ge Hetero pin Photodiode 2. The photodiode 2 includes two electrodes 4 and 6, a Ge base 8, and a Ge collector 10. The Ge base 8 is sized at ~1 µm from the electrode 4 to the Si junction 12. The Ge collector 10 is sized at ~1 µm from the junction 12 to the electrode 6 to form a pn junction. Note the Ge base 8 has a higher electron concentration then the Ge collector 10.

Higher electric field application is generally necessary for photodetectors to achieve higher responsivity. However, the breakdown voltage (VBR) is lower in narrow band gap semiconductors which increases reverse leakage currents. Thus, high field application is hard in photodetectors with similar bandgap Ge.

Figure 2:
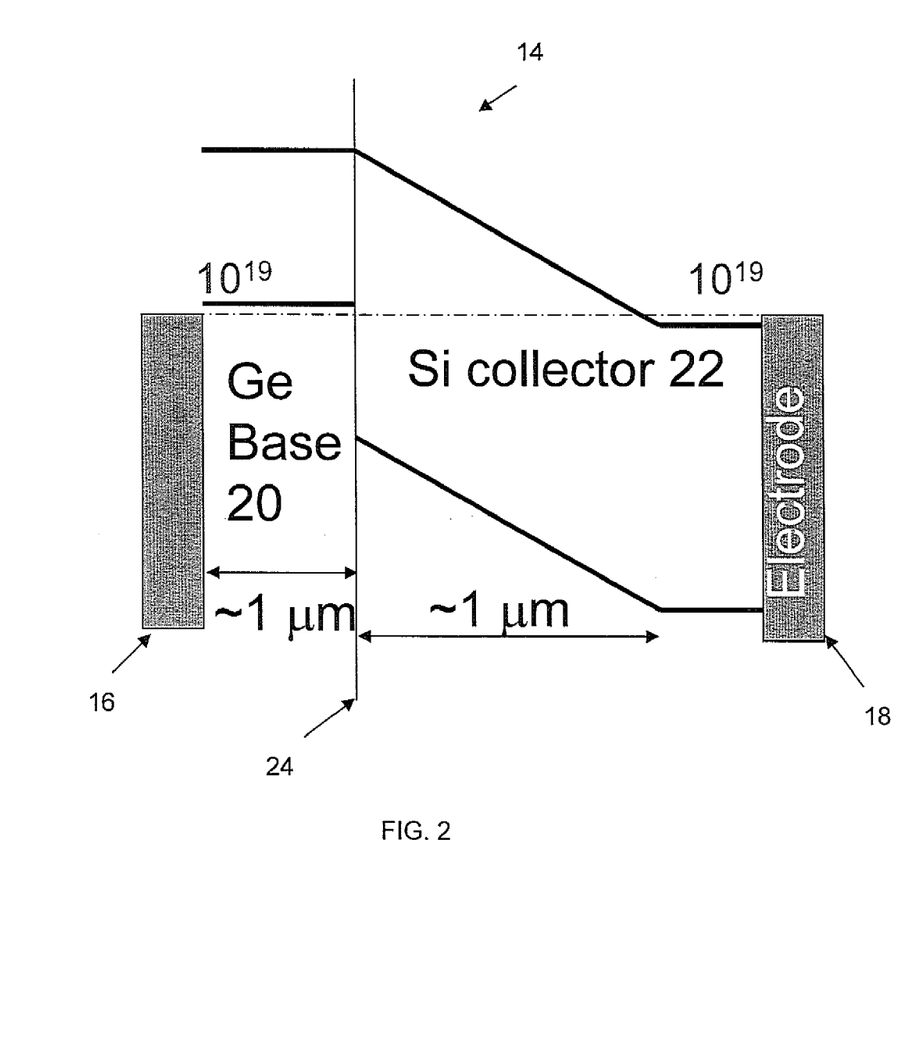
FIG. 2 is a schematic diagram that illustrates the operations of a Ge/Si hetero pin photodiode.

FIG. 2 illustrates the operations of a Ge/Si hetero pin photodiode 14. The photodiode 14 includes two electrodes 16 and 18, a Ge base 20, and a Si collector 22. The Ge base 20 is sized at ~1 µm from the electrode 16 to the Ge/Si heterojunction 24. The Si collector 22 is sized at ~1 µm from the Ge/Si heterojunction 24 to the electrode 18 to form the Ge/Si photodiode 14. Note there is a substantial discontinuity in electron concentration at the heterojunction 24.

Electric fields are present only in the Si layers that form the Si collector 22, which allows for higher breakdown voltages and lower leaking currents. Light is absorbed in the Ge base 20 and only electrons travel to get to the Si collector 22 and no holes travel.

Figure 3:
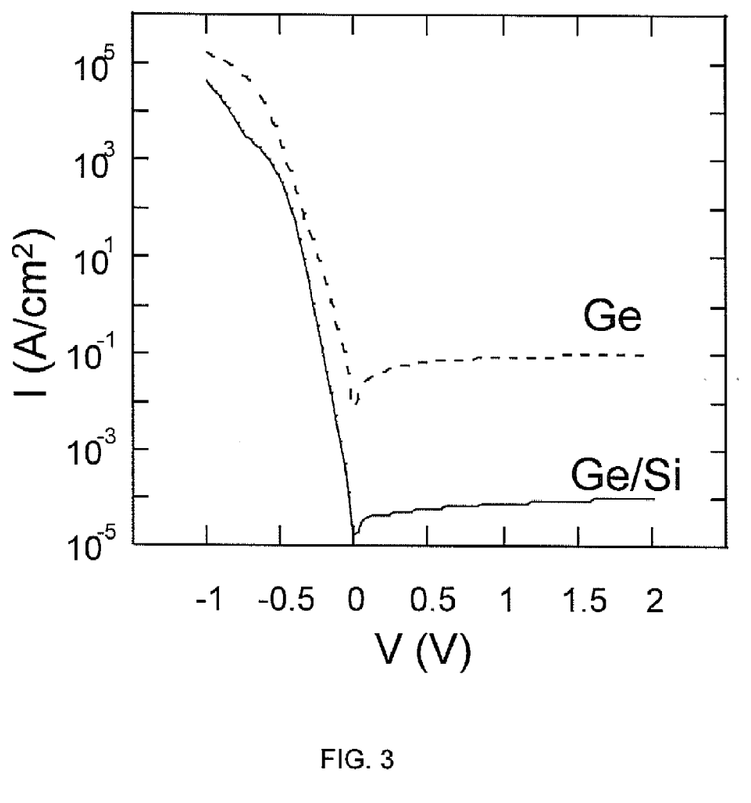
FIG. 3 is a graph that demonstrates the performance between the Ge pin photodiode and Ge/Si hetero pin photodiode as shown in FIGS. 1 and 2.
Figure 4:
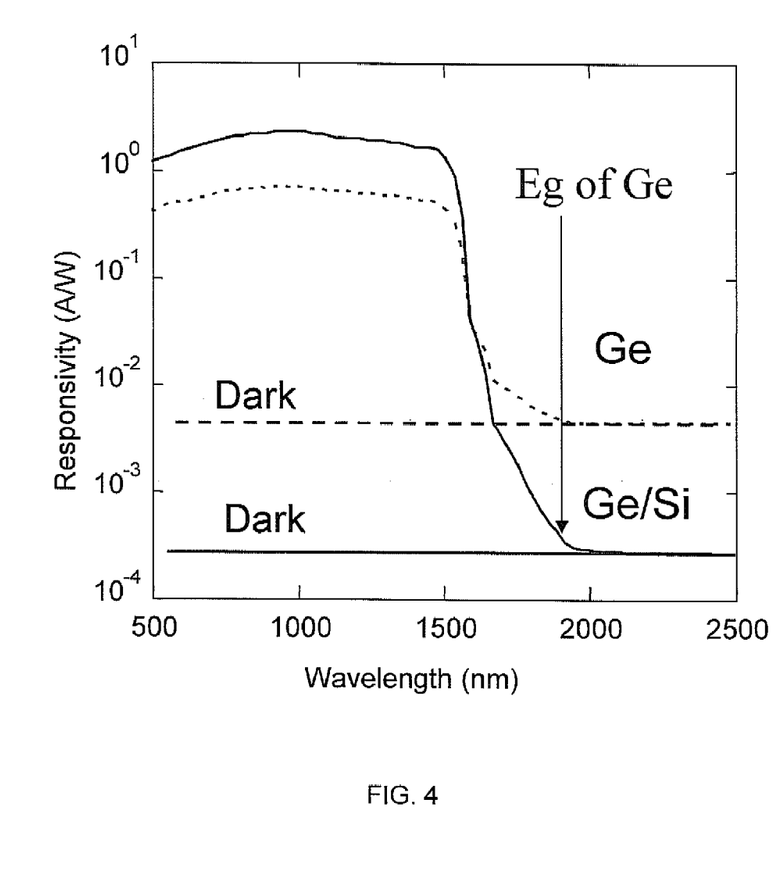
FIG. 4 is a graph that demonstrates the performance of the photodiodes described in FIGS. 1 and 2.

FIG. 3 shows the performance between the Ge pin photodiode and Ge/Si hetero pin photodiode as shown in FIGS. 1 and 2, respectively. Note there is a lower reverse current density in the Ge/Si hetero pin photodiode 14 than the Ge pin photodiode 2 because of a larger bandgap. FIG. 4 illustrates the performance of the photodiodes 2, 14 described in FIGS. 1 and 2 by showing that the Ge/Si pin photodiode 14 has a larger increase in responsivity in the wavelength range shorter than ~1800 nm because of the low reverse leakage. Note there is a lower responsivity under darkness.

Figure 5:
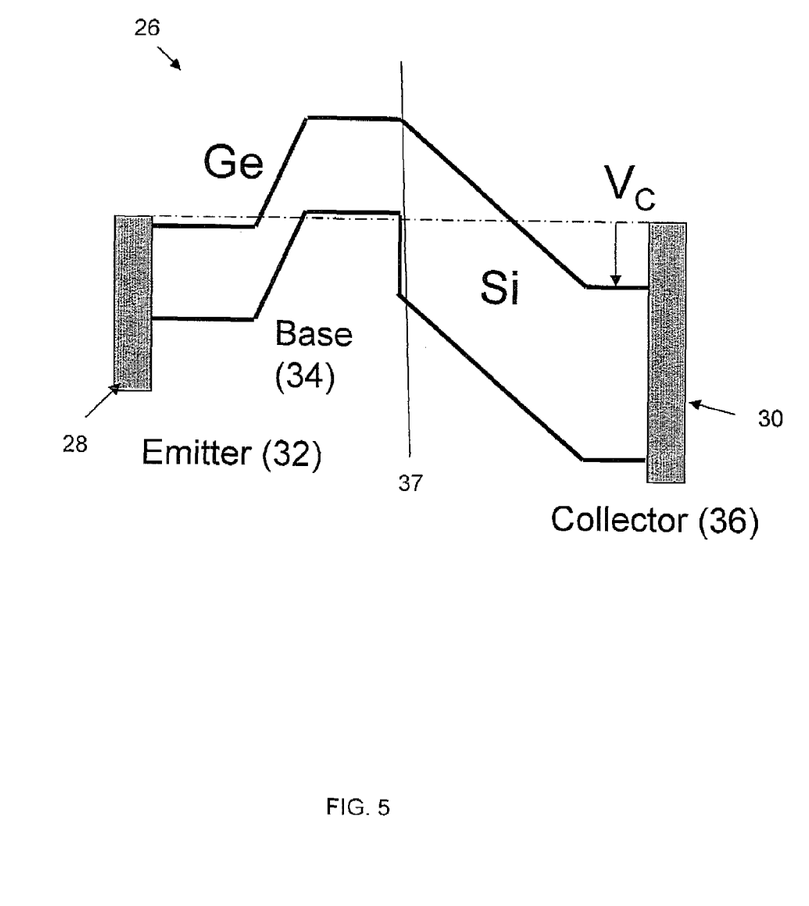
FIG. 5 is a schematic diagram that illustrates a Ge/Si hetero phototransistor structure.

FIG. 5 illustrates a Ge/Si hetero phototransistor structure 26 and operation. The phototransistor includes two electrodes 28 and 30, an emitter 32, a base 34, and a collector 36. The emitter 32 and base 34 are comprised of Ge and the collector 36 is comprised of Si. Note there are no large discontinuities in the voltage and electron concentrations.

This structure 26 operates when energy of the light is ($E_g$(Ge)<hv<$E_g$(Si)), which is illuminated from the Si side or from the Ge side. The light generates the electrons and holes in the base, lowering the base's barrier for electrons. The electrons are injected from the emitter 32 to the base and collected by the collector 36, which leads to a gain. Essentially, the phototransistor 26 is similar to the photodiode 14 discussed herein with additional voltage illustrated in the high $V_c$. Also, a heterointerface are formed at the base/collector junction 37 that formulate the creation of the high $V_c$.

Figure 6:
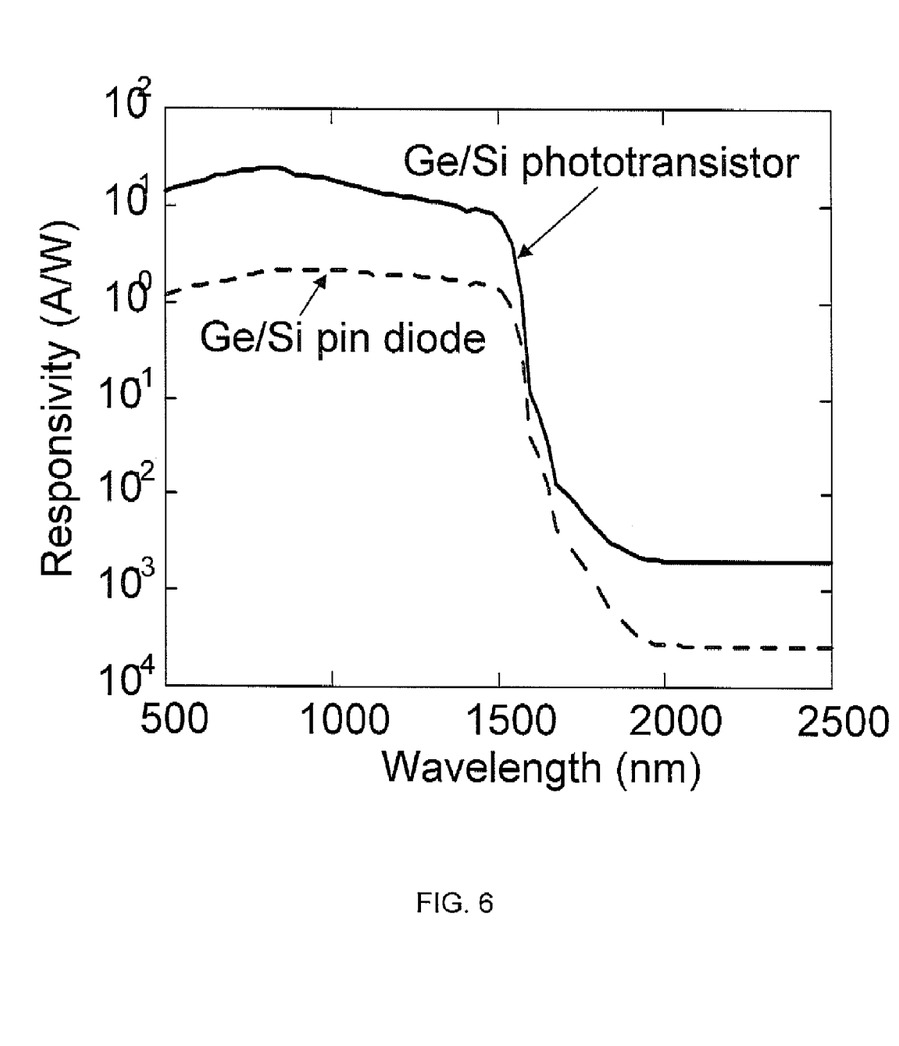
FIG. 6 is a graph that demonstrates the responsivity of a Ge/Si hetero phototransistor and compares that to a responsivity of Ge/Si pin diode.

FIG. 6 demonstrates the responsivity of the Ge/Si hetero phototransistor 26 and compares that to the responsivity of Ge/Si pin diode 14. Note the gain of the Ge/Si hetero phototransistor 26 is a factor of 10 as compared to the Ge/Si pin diode 14.

Figure 7:
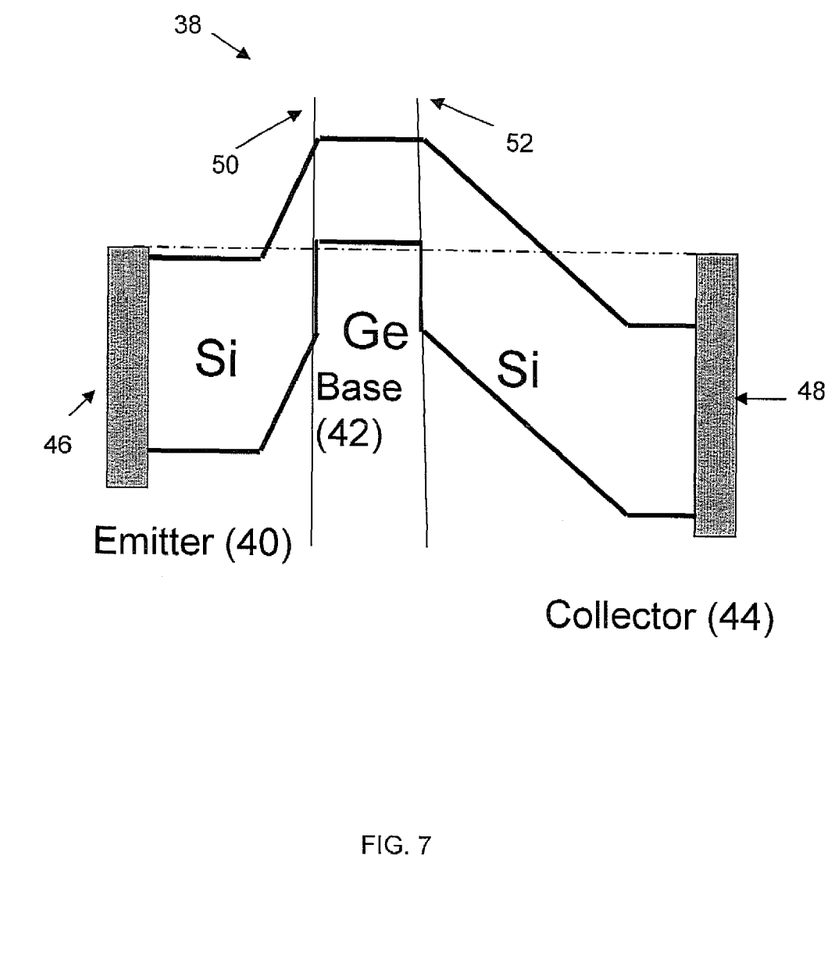
FIG. 7 is a schematic diagram that illustrates a Si/Ge/Si Double hetero bipolar phototransistor.

FIG. 7 illustrates a Si/Ge/Si Double hetero bipolar phototransistor 36. The bipolar transistor 36 includes two electrodes 46 and 48, an emitter 40, a base 42, and a collector 44. The base 42 comprises a Ge and the emitter 40 and the collector 44 comprise Si. The emitter 40 and collector 44 form a Si/Ge heterojunctions 50, 52 with the base 42. Note at the heterojunctions 50, 52 the dopant levels are high and there is more gain then the single Ge/Si hetero phototransistor 26.

Note the structures described in FIGS. 2, 5, and 7 utilize heavy doping at hetero junctions 24, 36, 50, and 52. Note in all these structures the heterojunctions are all pinned near the Ge valence band. The heavy doping of positive ions (p) at the heterojunctions regions can be used to make the depletion layer associated with Fermi level ($E_F$) pinning thin. Electrons in these structures can tunnel through the depletion layer formed at the heterojunctions. Heavy doping of negative ions (n) can be used at the interface which makes the depletion layers thin.

In other embodiments, because of the lattice mismatch in Ge/Si heterojunctions, this involves a high density of dislocations which pins the Fermi level ($E_F$). The $E_F$ pinning prevents device operations. The invention utilizes SiGe alloy interlayers to allow for Fermi level ($E_F$) unpinning. The $E_F$ unpinning is the key for Ge heterojunctions in both photodiodes and phototransistors.

Figure 8:
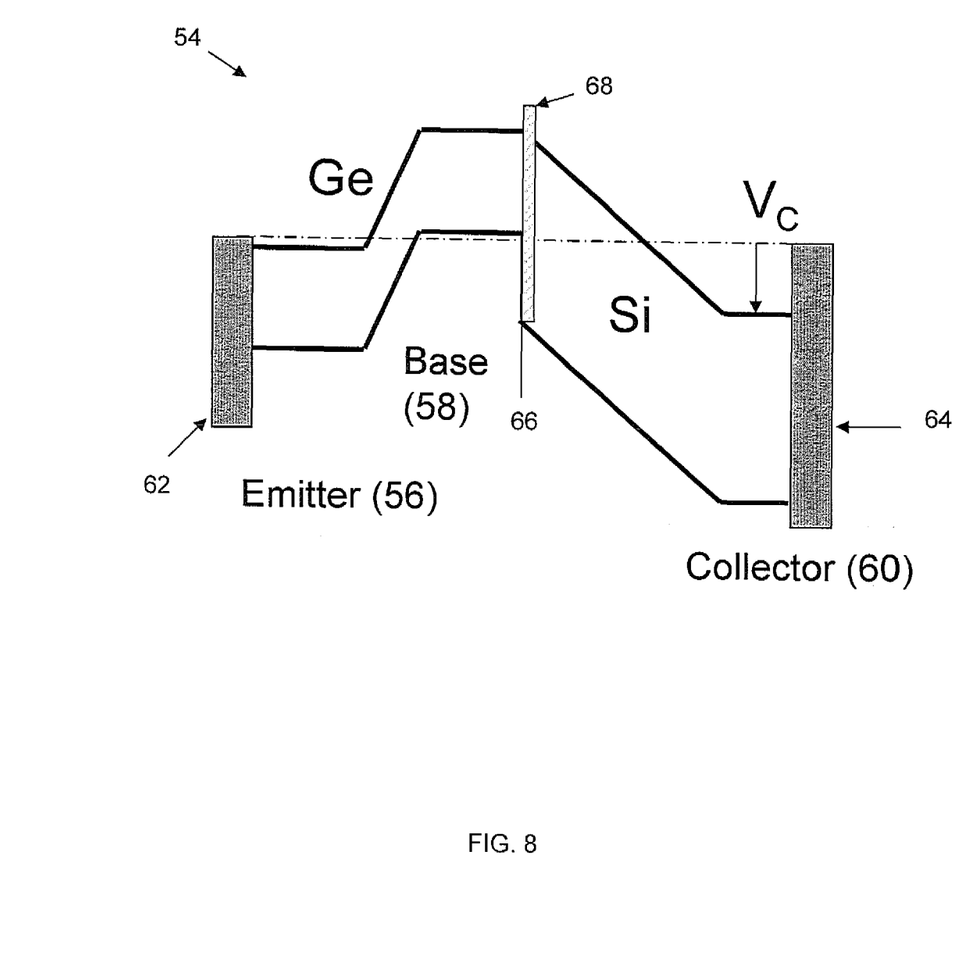
FIG. 8 is a schematic diagram that illustrates a Ge/Si heterojunction bipolar phototransistor.

FIG. 8 shows a Ge/Si heterojunction bipolar phototransistor 54. The phototransistor 54 includes two electrodes 60, 64, an emitter 56, a base 58, and collector 60. The emitter 56 and base 58 comprise a heavily doped Ge and the collector 60 comprises Si. A heterojunction 66 is formed between the base 58 and the collector 60, and includes SiGe alloy interlayer 68. The phototransistor 54 is similar to the phototransistor 26, they both provide gain. The heterojunction 66 allows for the high breakdown voltage ($V_C$). Note a pnp phototransistor can also be obtained with this arrangement.

Light is emitted from the emitter 56 from the Si side and generates electrons and holes in the base, lowering the base's 58 electron barrier. The electrons are injected from the emitter 56 to the base 58 and collected by the collector 60, which leads to the associated gain.

There are a high density of dislocations at the interface between Ge and Si. These defects are formed due to the lattice mismatch between Si and Ge, and provide recombination centers of carriers generated by light. Therefore, devices with Si and Ge interfaces have not worked. Such dislocations produce recombination centers when a SiGe alloy is formed at the "interlayer" between Ge and Si. This finding allows the SiGe alloy to be a key layer.

Figure 9:
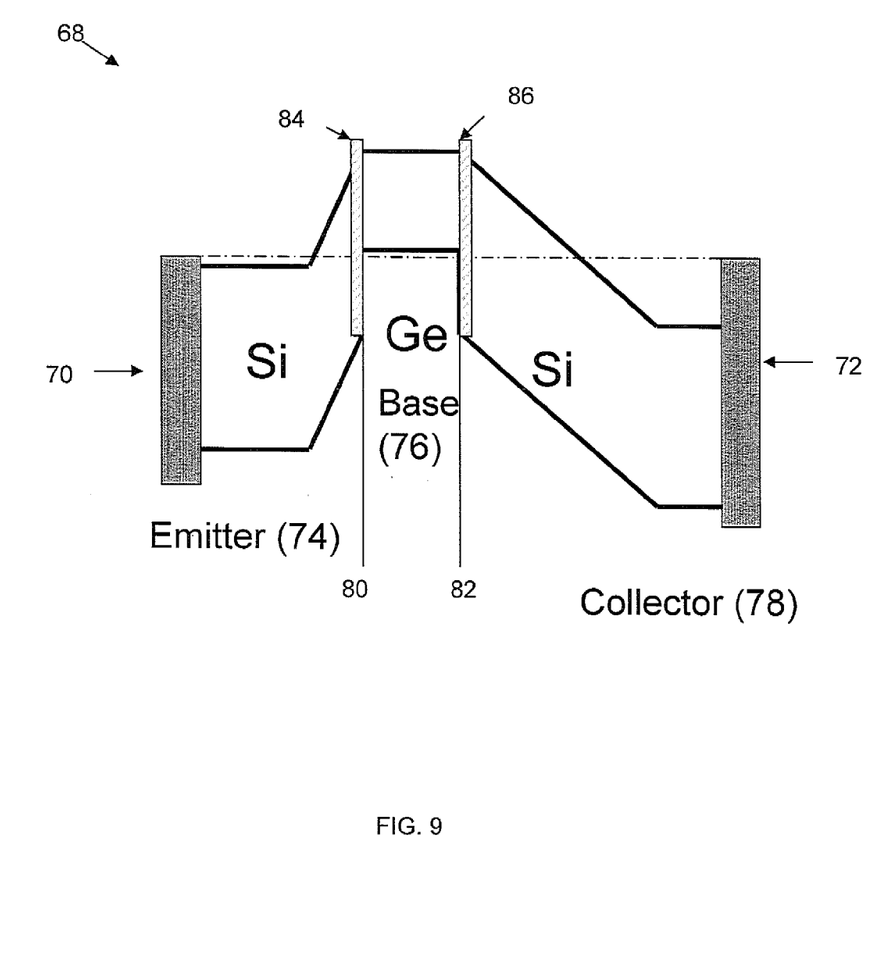
FIG. 9 is a schematic diagram that illustrates a Ge/Si double heterojunction bipolar phototransistor.

FIG. 9 illustrates a Ge/Si double heterojunction bipolar phototransistor 68. The phototransistor 68 includes two electrodes 70 and 72, an emitter 74, a base 76, and a collector 78. The emitter 70 and collector 78 comprise Si, and the base 76 comprises a heavily doped Ge layer. Also, the base 76 includes two heterojunctions 80, 82 between the base 76 and the emitter 74 and collector 78. There are two SiGe alloy interlayers 84, 86 formed at the heterojunctions 80, 82.

The phototransistor 68 allows the suppression of electron and hole recombination at the heterojunction 84. In the heterojunction 66 discussed in FIG. 8, lowering the potential in the base 58 allows recombination between the electrons in the emitter 56 and holes in the base 58, which does not produce a higher gain as produced by the phototransistor 68. Because of the double heterojunction, holes are confined in the base 76, achieving a higher gain.

Figure 10A:
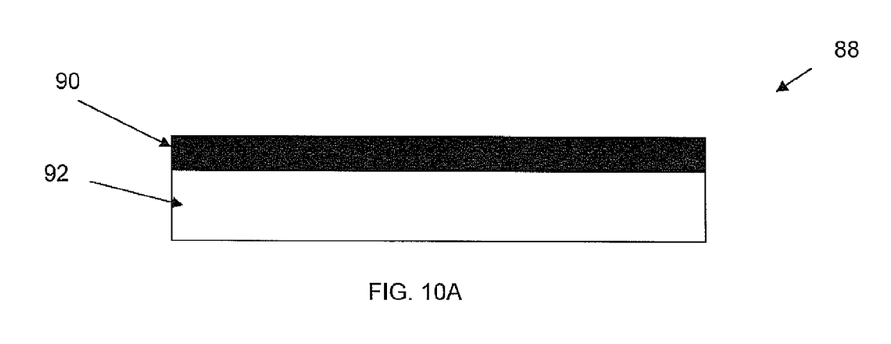
FIGS. 10A-10B are schematic diagrams that illustrate the formation of a SiGe alloy interlayer.
Figure 10B:
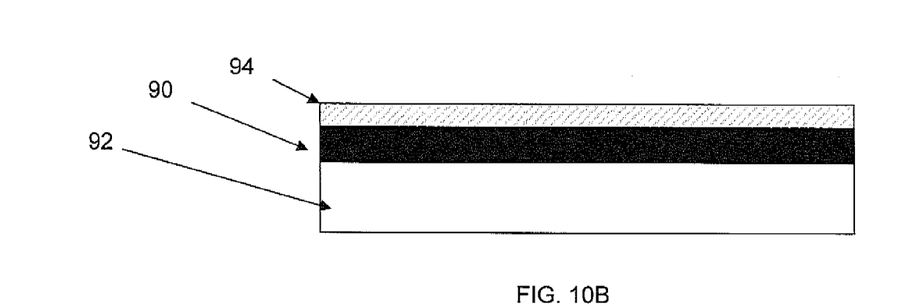

FIGS. 10A-10B illustrate the formation of a SiGe alloy interlayer 88. FIG. 10A shows a cross-section of a SiGe alloy interlayer 88. The interlayer 88 includes a thin Si layer 90 that is deposited on a Ge layer 92. Note there are dislocations present at the interface between the Si and Ge layers 90 and 92, indicating the Si/Ge interface EF is pinned. FIG. 10B shows a second cross-section illustrating the oxidation of the Si layer 90 to form a $SiO_2$ layer 94. The oxide-semiconductor interface is formed within the Si layer 90, and the Si layer 90 partly remains at the interface, for example, $SiO_2$/Si/Ge. Also, $SiO_2$/Si interface is unpinned and so is the Ge/Si interface.

Although the present invention has been shown and described with respect to several preferred embodiments thereof, various changes, omissions and additions to the form and detail thereof, may be made therein, without departing from the spirit and scope of the invention.

What is claimed is:

1. A photodiode comprising:
    a base that consists entirely of Ge;
    a collector that consists entirely of Si-based materials; and
    at least one Si/Ge heterojunction positioned between said base and collector for allowing the unpinning of Fermi energy level ($E_F$) of said photodiode, said at least one Si/Ge heterojunction being pinned approximately to the Ge valence band and doped to produce one or more thin depletion layers associated with said Fermi energy level, said at least one Si/Ge heterojunction comprises heavily doped SiGe alloy interlayers comprising an oxide layer used for unpinning of the Fermi energy level ($E_F$).

2. The photodiode of claim 1, wherein said base comprises a plurality of layers of Ge.

3. The photodiode of claim 1, wherein said collector comprises a plurality of layers of Si.

4. The photodiode of claim 1 further comprising at least two electrodes.

5. The photodiode of claim 1, wherein said base comprises a length of approximately 1 μm.

6. The photodiode of claim 1, wherein said collector comprises a length of approximately 1 μm.

7. The photodiode of claim 1, wherein said heterojunction comprises heavy doping of positive and negative ions.

8. A phototransistor comprising:
    an emitter;
    a base comprising entirely of doped Ge; and
    a collector that consists entirely of Si-based materials;
    at least one Si/Ge heterojunction positioned between said emitter, base, and collector for allowing the unpinning of Fermi energy level ($E_F$) of said phototransistor, said at least one Si/Ge heterojunction being pinned approximately to the Ge valence band and doped to produce one or more thin depletion layers associated with said Fermi energy level, said at least one Si/Ge heterojunction comprises heavily doped SiGe alloy interlayers comprising an oxide layer used for unpinning of the Fermi energy level ($E_F$).

9. The phototransistor of claim 8, wherein said base comprises a plurality of layers of Ge.

10. The phototransistor of claim 8, wherein said collector comprises a plurality of layers of Si.

11. The phototransistor of claim 8, wherein said emitter comprises a plurality of layers of Ge.

12. The phototransistor of claim 8, wherein said emitter comprises a plurality of layers of Si.

13. The phototransistor of claim 8 further comprising at least two electrodes.

14. The phototransistor of claim 8, wherein said base comprises a length of approximately 1 µm.

15. The phototransistor of claim 8, wherein said collector comprises a length of approximately 1 µm.

16. The phototransistor of claim 8, wherein said at least one heterojunction comprises heavy doping of positive and negative ions.

17. The phototransistor of claim 8, wherein said at least one heterojunction comprises one heterojunction.

18. The phototransistor of claim 8, wherein said at least one heterojunction comprises two heterojunction.

19. The photodiode of claim 1, wherein said collector comprises Si.

20. The photodiode of claim 1, wherein said collector comprises SiGe.

21. The phototransistor of claim 8, wherein said collector comprises Si.

22. The phototransistor of claim 8, wherein said collector comprises SiGe.

* * * * *